(12) United States Patent
Musch et al.

(10) Patent No.: US 8,664,980 B2
(45) Date of Patent: Mar. 4, 2014

(54) FREQUENCY SYNTHESIZER FOR GENERATING A LOW NOISE AND LOW JITTER TIMEBASE OF A REFERENCE SIGNAL

(71) Applicant: KROHNE Messtechnik GmbH, Duisburg (DE)

(72) Inventors: Thomas Musch, Bochum (DE); Robert Storch, Ludenscheid (DE)

(73) Assignee: KROHNE Messtechnik GmbH, Duisburg (DE)

( * ) Notice: Subject to any disclaimer, the term of this patent is extended or adjusted under 35 U.S.C. 154(b) by 0 days.

(21) Appl. No.: 13/690,773

(22) Filed: Nov. 30, 2012

(65) Prior Publication Data

US 2013/0147522 A1    Jun. 13, 2013

(30) Foreign Application Priority Data

Dec. 2, 2011   (DE) .......................... 10 2011 119 983
May 21, 2012   (DE) .......................... 10 2012 009 868

(51) Int. Cl.
*H03B 21/00*   (2006.01)

(52) U.S. Cl.
USPC ............ 327/105; 327/106; 327/107; 708/271

(58) Field of Classification Search
USPC .................................. 327/105–107; 708/271
See application file for complete search history.

(56) References Cited

U.S. PATENT DOCUMENTS

| | | | | |
|---|---|---|---|---|
| 5,834,987 A | * | 11/1998 | Dent | 332/127 |
| 6,342,819 B1 | * | 1/2002 | Yamada | 331/25 |
| 6,566,964 B1 | * | 5/2003 | Hirano | 331/1 A |

FOREIGN PATENT DOCUMENTS

| | | |
|---|---|---|
| DE | 10244348 | 4/2004 |
| DE | 102004063935 | 3/2006 |
| DE | 102010011128 | 9/2011 |

* cited by examiner

*Primary Examiner* — Kenneth B. Wells
(74) *Attorney, Agent, or Firm* — Roberts Mlotkowski Safran & Cole, P.C.; David S. Safran

(57) ABSTRACT

A frequency synthesizer for generating a low noise and low jitter timebase of a reference signal generates first and second output signals a difference frequency that is low enough for use in sub-scanning is implemented with a first incrementer, having a preset increment and a preset end value $E_1$ controlling a first fractional divider and a second incrementer having a preset increment and a present end value $E_2$ controlling a second fractional divider, wherein each of the incrementers is clocked from the output signal of each fractional divider so that, when the end value $E_1$, $E_2$ is reached, an end signal is output and the incrementers are reset to a carryover value as a new starting value and the end signal is switched between the division factors of the fractional dividers so that the switching sequence of the end signal is periodic with the output signals of the fractional dividers.

11 Claims, 1 Drawing Sheet

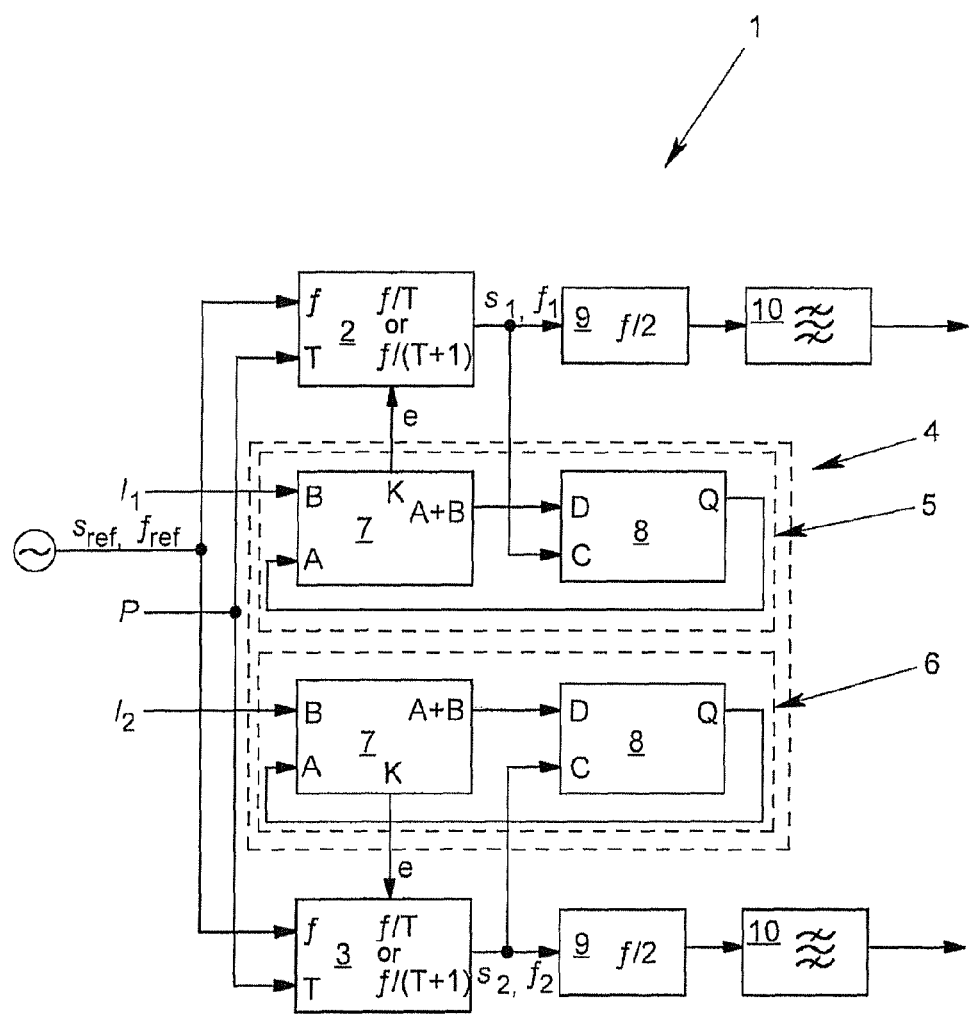

FREQUENCY SYNTHESIZER FOR GENERATING A LOW NOISE AND LOW JITTER TIMEBASE OF A REFERENCE SIGNAL

BACKGROUND OF THE INVENTION

1. Field of the Invention

The invention relates to a frequency synthesizer for generating a low noise and low jitter time base of a reference signal with the frequency $f_{ref}$, wherein the time base consists of a first output signal with the frequency $f_1$ and a second output signal with the frequency $f_2$, having a first fractional divider with the division factor $T_1$ for generating the first output signal from the reference signal, a second fractional divider with the division factor $T_2$ for generating the second output signal from the reference signal and a controller for periodically-clocked switching of the first fractional divider between $T_1$ and $(T_1+1)$ using the first output signal and for periodically-clocked switching of the second fractional divider between $T_2$ and $(T_2+1)$ using the second output signal.

2. Description of Related Art

Such frequency synthesizers are particularly suitable for providing the time base for a fill level measuring device, which determines the fill level of a medium in a container by means of time domain reflectometry (TDR). Subsequently, the frequency synthesizer of interest is illustrated by this example of use, of course, it is not limited to such use. Fill level measuring devices operating with time domain reflectometry have at least one conductor extending generally from above into the container and the medium, whose fill level is to be determined. The fill level measuring device emits electromagnetic signals along the conductor in the direction of the medium and receives the components of the signals that have been reflected back from the interface layer of the medium, i.e., on the surface of the medium, to the level measuring device. The medium can be e.g., liquids, powders or granules. The reflected proportion of the signal depends on the dielectric constant of the medium and increases with this. The running time of a signal, which is the length of time that the signal requires from the fill level measuring device to the surface of the medium and the reflected portion of the signal back to the fill level measuring device, is proportional to the distance of the fill level measuring device to the surface of the medium. The fill level is calculated using the distance of the medium from the fill level measuring device, together with the geometry of the container. Changing environmental conditions, such as a rising or falling ambient pressure or a rising or falling temperature, do not affect measurement accuracy in fill level measuring devices using time domain reflectometry. Also, the transit time of the signals is independent of the dielectric constant of the medium on the surface of which the reflection takes place. Time domain reflectometry is also e.g., used in cable testing and its principle is similar to radar methods.

Time domain reflectometry is accordingly based on the measurement of the transit time of an electromagnetic signal. If the container is nearly completely filled with medium, so that the surface of the medium is, for example, only 15 cm below the fill level measuring device, then the total transit distance of the electromagnetic signal from the fill level meter to the surface of the medium and back to the fill level measuring device is only 30 cm, which corresponds to a duration of the electromagnetic signal of 10 ns. The measurement of such short time spans for determining the fill level is associated with high effort and associated costs, which is why scanning of the electromagnetic signals required for time measurement is carried out by sub-sampling. For the sub-scan, a time base is required with two high-frequency signals, whose frequency difference is as low as possible.

The aforementioned frequency synthesizer provides this time base with the first output signal having the frequency $f_1$ and the second output signal having the frequency $f_2$, wherein the difference frequency is $\Delta f = f_1 - f_2$. Without limiting the generality of illustration, it is assumed here that the frequency $f_1$ is larger than the frequency $f_2$. Individual electromagnetic signals are emitted at a transmission rate in the direction of the medium, which corresponds to the frequency $f_1$ and the electromagnetic signals, from which the transit time is calculated and which belong to waves reflected at the surface of the medium, are sampled at a sampling rate that corresponds to the frequency $f_2$. The frequencies $f_1$ and $f_2$ are typically in the range of a few megahertz, and the difference frequency is usually in the range of a few 100 Hz. Due to the high transmission rate and the resulting low temporal spacing of individual, successive, emitted electromagnetic signals, reflected electromagnetic signals successively received from the fill level measuring device are virtually identical in the sense that the reflected signals are not affected by changes in the fill level, because changes in the fill level take place very slowly in relation to the transmission rate. Since the scanning of the electromagnetic signals is carried out with a sampling rate that is only slightly below the transmission rate, the sampling of successive signals is shifted slightly, so that sub-scanning in conjunction with virtually unchanged reflected signals results in an accurate picture of the signals, which is used to calculate the transit time. The transit time of the signals, and in turn the fill level can be calculated using the sub-sampled signals. A time base that is low-noise and low-jitter is indispensable for high accuracy in sub-sampling. Noise would degrade the signal-to-noise ratio and jitter would lead to uncertainty in the sampling.

German Patent Application DE 102 44 348 A1 describes a frequency synthesizer with a reference oscillator that generates a first output signal having the frequency $f_1$ and supplies the first output signal frequency-divided by the division factor M to a mixer. A control oscillator produces a second output signal having the frequency $f_2$ and the second output signal frequency-divided by the division factor N is also supplied to the mixer. The signal mixed from the frequency-divided first output signal and the frequency-divided second output signal is supplied to a phase-frequency discriminator, which evaluates this signal and the first output signal frequency-divided by the division factor L. The controlled variable of the phase frequency discriminator is filtered by a loop filter and is the control input variable of the control oscillator. In practice, it has been shown that the phase-locked loop has a relatively high momentum, but the achievable stability and the associated noise behavior needs improvement. In addition, the cost in terms of circuit technology is considerable.

A frequency synthesizer is known from German Patent Application DE 10 2004 063 935 A1 comprising a reference oscillator and a first frequency divider with the division factor $V_1$ connected downstream from the reference oscillator for output of the first output signal with the frequency $f_1$ and comprising a control oscillator and a second frequency divider with the division factor of $V_2$ connected downstream from the control oscillator for output of the second output signal having the frequency $f_2$. The output signal of the reference oscillator is divided by a third frequency divider with the division factor M and supplied to a mixer. Accordingly, the output signal of the control oscillator is divided by a fourth frequency divider with the division factor N and supplied to the mixer. The output signal of the mixer is one of two input signals of a phase-frequency discriminator. The other input signal of the phase frequency discriminator is the output signal of the reference oscillator divided by a fifth frequency divider with the division factor L. The controlled variable of the phase frequency discriminator is fed to a loop filter and the output signal of the loop filter is the controlled variable for the control oscillator. The output of the first output signal by the first frequency divider and the second output signal by means of the second frequency divider allows that the two oscillators, namely the reference oscillator and the control oscillator, disturb each other much less due to coupling effects since the two oscillators operate now with widely varying frequencies. However, high demands are placed on the mixer in respect to noise characteristics, thus resulting in considerable analog circuitry.

Furthermore, a frequency synthesizer is known from German Patent Application DE 10 2010 011 128 A1 comprising a reference oscillator and an integral first frequency divider with dividing factor $V_1$ connected downstream from the reference oscillator for producing the first output signal with the frequency $f_1$ and a control oscillator with an integral second frequency divider with the division factor of $V_2$ connected downstream from the control oscillator for generating the second output signal having the frequency $f_2$. The signal of the reference oscillator divided by a fractional third frequency divider with the division factor R is supplied to a phase-frequency discriminator. Further, the phase-frequency discriminator is also supplied with the signal of the reference oscillator divided by a fractional frequency divider with the third division factor L. The controlled variable of the phase frequency discriminator is filtered by a loop filter and controls the control oscillator.

Although it is possible to generate very small difference frequencies with this frequency synthesizer, this involves considerable complexity and also goes hand in hand with corresponding costs. A phase-locked loop comprising the phase-frequency discriminator, the loop filter, the control oscillator, and the third frequency divider is also required for the function of the frequency synthesizer.

SUMMARY OF THE INVENTION

A primary object of the present invention is to provide a frequency synthesizer of the above type, which generates a first output signal having the frequency $f_1$ and a second output signal with the frequency $f_2$, wherein the difference frequency $\Delta f = f_1 - f_2$ is sufficiently small for use in sub-sampling, and whose manufacturing costs are reduced.

The frequency synthesizer according to the invention, in which the above object is achieved is initially and essentially wherein a first incrementer having the preset increment $I_1$ and the preset end value $E_1$ controls the first fractional divider and a second incrementer having the preset increment $I_2$ and the present end value $E_2$ controls the second fractional divider, wherein each of the incrementers is clocked from the output signal of each fractional divider, when the end value $E_1$, $E_2$ has been reached, an end signal e is output and the incrementers are reset to the carryover as a new start value and the end signal is switched between both division factors of the fractional dividers so that the switching sequence of the end signal is periodic with the output signal of the fractional divider.

The frequency of the first output signal is $$f_1 = \frac{f_{ref}}{T_1 + \frac{I_1}{E_1}}$$

and the frequency of the second output signal is correspondingly $$f_2 = \frac{f_{ref}}{T_2 + \frac{I_2}{E_2}}.$$

Here, the division factors $T_1$, $T_2$, the increments $I_1$, $I_2$, and the end values $E_1$, $E_2$ are positive integers, wherein the division factors are selected so that they can be processed by the fractional dividers, the end values are chosen such that they can be processed by the incrementers and the increments are always smaller or equal to the respective end value. Frequencies of the output signals can be generated using the ratio of increment to end value, for which:

$$\frac{f_{ref}}{T_{1,2}} \leq \frac{f_{ref}}{T_{1,2} + \frac{I_{1,2}}{E_{1,2}}} \leq \frac{f_{ref}}{T_{1,2} + 1}.$$

The difference frequency between the first output signal and the second output signal is $$\Delta f = f_1 - f_2 = \left(\left(T_1 + \frac{I_1}{E_1}\right)^{-1} - \left(T_2 + \frac{I_2}{E_2}\right)^{-1}\right) f_{ref}.$$

The increments and the end value can be realized for the use of sufficiently low difference frequencies by an executable, suitable choice of division factors by a person skilled in the art.

The generation of the first output signal and the second output signal is carried out, compared to the frequency synthesizer known from the prior art, with reduced technical effort and, therefore, with reduced costs, wherein the output signals are low-noise and low jitter. Thus, neither a phase-frequency detector nor a phase locked loop is required. In addition, no more than two—fractional—frequency dividers are required. Control of the fractional frequency divider is performed by incrementers, which can be more easily implemented compared to controllers known from the prior art.

In a preferred design of the frequency synthesizer according to the invention, the division factor $T_1$ is equal to the division factor $T_2$. To simplify, a new division factor is, thus, defined by $T=T_1=T_2$. Thus, the frequency difference is calculated in accordance with $$\Delta f = \frac{E_1 I_2 - E_2 I_1}{(E_1 T + I_1)(E_2 T + I_2)} f_{ref}.$$

By using the same division factor $T=T_1=T_2$ for both incrementers, control of the incrementers is simplified without increasing the frequency difference to the extent that the application is impaired.

In a very particularly preferred design of the invention, each of the two incrementers comprises both an adder and a memory. Each of the adders has a first adder input, a second adder input, an adder output and an end output for the output of the end signal. The first adder outputs the end signal $E_1$ and the second adder, the end signal $E_2$. If the sum of the data word applied to the first adder input and the data word applied to the second adder input is greater than the predetermined end value, the end signal is output at the end output and the adder is reset to the carryover as a new starting value.

Each of the memories has a memory input, memory output, and a clock input fed by the output signal of the respective frequency divider. A data word applied at the memory input is output at the memory output, delayed by one clock period. The memory input is connected to the adder output and the memory output is connected to the first adder input.

The increment $I_1$ is applied to the second adder input of the first adder and the increment $I_2$ is applied to the second adder input of the second adder. In the initial state, the increment is applied to the adder output and to the memory output, the value is 0. After the first clock cycle, the increment is applied to the memory output, so that the increment is also applied to the first adder input, and the sum of the data word at the first adder input and the data word at the second adder input is applied to the adder output, which is a double increment. This procedure is repeated until the clock cycle, at which the sum is no longer less than or equal to the end value. Then, the final signal is output and the adder reset to the carryover as a new start value. In one design of the invention, the end value of the adder is equal to the maximum value of the adder. If the adder has, for example, a width of m bits, the maximum possible number is $2^m-1$.

To minimize the difference frequency, the increment $I_1$ can be selected at a value one less than the final value $E_1$ and/or the increment $I_2$ can be selected at a value one less than the end value $E_2$. In addition, the division factors can be selected to be $T=T_1=T_2$. Thus, the difference frequency is $$\Delta f = \frac{E_2 - E_1}{[E_1(T+1)-1][E_2(T+1)-1]} f_{ref}.$$

The value of the counter must be 1 in order to reach the minimum frequency difference. This can be achieved when the final value $E_2$ is greater than the final value $E_1$ by a value of one. Thus, the minimum frequency difference is $$\Delta f = \frac{1}{[E_1(T+1)-1][(E_1-1)(T+1)-1]} f_{ref}.$$

The output signal of a frequency divider, including a fractional frequency divider, has a very small duty cycle. In a preferred design of the invention, therefore, the output signal of the frequency divider is halved in frequency by a frequency divider (by 2), wherein the duty cycle is symmetrized and consequently the fundamental frequency component is increased and accordingly the interference can be reduced. The frequency divider (by 2) can be a clock-controlled flip-flop, in particular a clock-controlled D-flip-flop can be implemented.

In a further preferred design of the invention, the output signal is filtered by a bandpass filter, whose center frequency is equal to the frequency of the output signal. In bandpass filtering, interfering signals are attenuated outside the passband. Ceramic filters and/or quartz filters can be used as bandpass filters. Quartz filters are very similar to an ideal bandpass filter, but are considerably more expensive than ceramic filters, whereas the properties of ceramic filters are less similar to those of an ideal band-pass filter.

In a very particularly preferred design of the invention, the first output signal and the second output signal are filtered by a respective band-pass filter and the bandwidth of the band-pass filters is adapted to the interference resulting from the periodicity of the switching sequences. A shortening of the switching sequences, for example, has the consequence that the distance between the noise in the frequency range of the fundamental frequency becomes larger. Using a suitable selection of the bandwidth of the bandpass filters and length of the switching sequences, interference can be effectively suppressed.

In detail, there are numerous possibilities for further developing and designing the frequency synthesizer according to the invention as will be apparent from reference to the description of preferred embodiments in conjunction with the accompanying drawings.

BRIEF DESCRIPTION OF THE DRAWING

The sole FIGURE diagrammatically depicts an exemplary embodiment of the frequency synthesizer according to the invention.

DETAILED DESCRIPTION OF THE INVENTION

With reference to the sole FIGURE, the frequency synthesizer 1 generates a first output signal $s_1$ with the frequency $f_1$ and a second output signal $s_2$ with the frequency $f_2$ from a reference signal $S_{ref}$ having the frequency $f_{ref}$. A first fractional frequency divider 2 generates the first output signal $s_1$ from the reference signal $s_{ref}$. A second fractional divider 3 generates the second output signal $s_2$ from the reference signal $s_{ref}$. The division factors T of both the first fractional divider 2 and the second fractional divider 3 are assigned the value P. A controller 4 switches the division factor T of the first fractional divider 2 periodically and clocked by the output signal $s_1$ between the value T and the value T+1. Accordingly, the controller 4 switches the division factor T of the second fractional divider 2 periodically and clocked by the output signal $s_2$ between the value T and the value T+1. The controller 4 is composed essentially of a first incrementer 5 for controlling the first fractional divider 2 and a second incrementer 6 for controlling the second fractional divider 3.

Each of the incrementers 5, 6 comprises an adder 7 and a memory 8. Each of the adders 7 has a first adder input A, a second adder input B, an adder output A+B and an end output K for output of the end signal e. The end value of the first adder 7 is $E_1$ and the end value $E_2$ of the second adder is $E_2$. Each of the memories 8 includes a memory input D, a memory output Q and a clock input C. A data word applied at the memory input D is output delayed by the memory 8 by one clock period at the memory output Q. The adder output A+B of the adder 7 is connected to the memory input D of the memory 8. The storage output Q is connected to the first adder input A. The increment $I_1$ is applied to the second adder input B of the first adder 7. Correspondingly, the increment $I_2$ is applied to the second input B of the second incrementer 7.

To explain the function of the incrementers 5, 6, the first incrementer 5 is considered. In the initial state, the value $I_1$ is applied to the adder output A+B of the first adder 7. With the first clock of the signal $s_1$ at the clock input C of the first memory 8, the value $I_1$ applied at the memory input D is displayed at the storage output Q, and thus, also at the first adder input A. The value 2I is now applied to the adder output A+B. This process is repeated while the value applied to the adder output A+B is less than or equal to the end value. When the final value $E_1$ is reached, the adder at the end output K outputs the end signal e. The end signal e switches the division factor T of the first fractional divider 2 from T to (T+1). After reaching the end value $E_1$, the adder 7 is reset, that is, the end signal e is reset and the adder output A+B is set to the value of the carryover as a new start value for the initial state. Here, the carryover is the greatest value of the adder output A+B, which is smaller than or equal to the end value $E_1$, wherein the increment $I_1$ is added to this value and the end value $E_1$ is subtracted.

The frequency $f_1$ of the first output signal $s_1$ is $$f_1 = \frac{f_{ref}}{P + \frac{I_1}{E_1}}$$

and the frequency $f_2$ of the second output signal $s_2$ is $$f_2 = \frac{f_{ref}}{P + \frac{I_2}{E_2}}.$$

The first adder 7 is set so that the increment $I_1$ is less than the end value $E_1$ by the value 1, thus $I_1 = E_1 - 1$. Correspondingly, the second adder is configured such that the increment is less than the end value $E_2$ by a value of 1, thus $I_2 = E_2 - 1$. Thus, the difference frequency is $$\Delta f = \frac{E_2 - E_1}{[E_1(P+1)-1][E_2(P+1)-1]} f_{ref}.$$

Furthermore, the end value $E_2$ is greater than the end value $E_1$ by the value 1, thus $E_2 = E_1 + 1$. Thus, the difference frequency is $$\Delta f = \frac{1}{[E_1(P+1)-1][(E_1-1)(P+1)-1]} f_{ref}.$$

Due to the manner of the production of the two output signals $s_1$ and $s_2$, the duty ratio of these signals is unbalanced. For symmetrization of the duty cycles, the output signals $s_1$, $s_2$ are fed to frequency dividers 9. Dividing the frequency in two is accompanied by symmetrization of the duty cycles of the output signals $s_1$, $s_2$. This symmetrization increases the fundamental frequency component in the output signals and consequently increases the signal-to-noise ratio. Due to the periodicity of the switching sequences of the end signals e, noise spectra result in the spectrum of the output signals $s_1$, $s_2$, whose distance from the fundamental frequency increases with decreasing length of the switching sequences. These noise spectra are adapted to the bandwidth of the band-pass filters, so that the noise spectra are largely suppressed. Ceramic filters are used as bandpass filters 10 here.

What is claimed is:

1. Frequency synthesizer for generating a low noise and low jitter time base of a reference signal $s_{ref}$ with a frequency $f_{ref}$, wherein the time base comprises a first output signal $s_1$ with a frequency $f_1$ and a second output signal $s_2$ with a frequency $f_2$, comprising:

a first fractional divider with the division factor $T_1$ for generating the first output signal $s_1$ from the reference signal $S_{ref}$, a second fractional divider with the division factor $T_2$ for generating the second output signal $s_2$ from the reference signal $s_{ref}$, and a controller for periodically-clocked switching of the first fractional divider between division factors $T_1$ and $T_1+1$ using the first output signal $s_1$ and for periodically-clocked switching of the second fractional divider between division factors $T_2$ and $T_2+1$ using the second output signal $s_2$ wherein a first incrementer having a preset increment $I_1$ and a preset end value $E_1$ controls the first fractional divider and wherein a second incrementer having a preset increment $I_2$ and a present end value $E_2$ controls the second fractional divider, wherein each of the incrementers is clocked from the output signal $s_1$, $s_2$ of each fractional divider, wherein, when the respective end value $E_1$, $E_2$ has been reached, an end signal e is output and the incrementers are reset to a carryover value as a new starting value and the end signal e is switched between the division factors of the fractional dividers so that the switching sequence of the end signal e is periodic with the output signal $s_1$, $s_2$ of the fractional divider.

2. Frequency synthesizer according to claim 1, wherein the division factor $T_1$ is equal to the division factor $T_2$.

3. Frequency synthesizer according to claim 1, wherein each of the incrementers has an adder and a memory, wherein the adder has a first adder input A, a second adder input B, an adder output A+B and an end output K for outputting of the end signal e, wherein the memory has a memory input D, a memory output Q and a clock input C associated with the output signal $s_1$, $s_2$ of each frequency divider, wherein the memory is adapted to output a data word resting on the memory input D at the memory output Q delayed by one clock cycle, wherein the memory input D is joined to the adder output A+B, wherein the memory output Q is joined to the first adder input A, wherein a data word with the value $I_1$ rests against the second adder input B of the first adder and wherein a data word with the value $I_2$ rests against the second adder input B of the second adder.

4. Frequency synthesizer according to claim 3, wherein at least one of the end value $E_1$ of the first adder and the end value $E_2$ of the second adder is a respective maximum value.

5. Frequency synthesizer according to claim 3, wherein the increment h is smaller than the end value $E_1$ by the value of 1 and/or that the increment $I_2$ is smaller than the end value $E_2$ by the value of 1.

6. Frequency synthesizer according to claim 3, wherein the end value $E_2$ is greater than the end value $E_1$ by a value of 1.

7. Frequency synthesizer according to claim 1, wherein a frequency bisector halves the frequency of the respective output signal $s_1$, $s_2$ and symmetrizes the respective output signal $s_1$, $s_2$.

8. Frequency synthesizer according to claim 7, wherein the frequency bisectors are clocked flip-flops.

9. Frequency synthesizer according to claim 1, further comprising a band-pass filter arranged for filtering of the output signals $s_1$, $s_2$.

10. Frequency synthesizer according to claim 9, wherein the bandpass filter is one of a ceramic filter and a quartz filter.

11. Frequency synthesizer according to claim 9, wherein the periods of the switching sequences are tuned to the band width of the bandpass filter in a manner such that interfering signals created by periodicity of the switching sequences are prevented.

\* \* \* \* \*